United States Patent
Kasahara

(10) Patent No.: US 10,409,157 B2
(45) Date of Patent: Sep. 10, 2019

(54) PATTERN FORMING METHOD

(71) Applicant: Toshiba Memory Corporation, Tokyo (JP)

(72) Inventor: Yusuke Kasahara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 141 days.

(21) Appl. No.: 15/233,905

(22) Filed: Aug. 10, 2016

(65) Prior Publication Data

US 2017/0068162 A1    Mar. 9, 2017

(30) Foreign Application Priority Data

Sep. 9, 2015   (JP) ................. 2015-177714

(51) Int. Cl.
*G03F 7/00* (2006.01)
*H01L 21/033* (2006.01)
*H01L 21/311* (2006.01)
*H01L 21/768* (2006.01)

(52) U.S. Cl.
CPC ........ *G03F 7/0002* (2013.01); *H01L 21/0337* (2013.01); *H01L 21/31144* (2013.01); *H01L 21/76816* (2013.01)

(58) Field of Classification Search
CPC ............... H01L 21/312; H01L 21/0337; H01L 21/3081; C08G 2261/74
USPC .................................................. 430/316, 317
See application file for complete search history.

(56) References Cited

U.S. PATENT DOCUMENTS

| | | |
|---|---|---|
| 7,601,647 B2 | 10/2009 | Jeon et al. |
| 8,974,682 B2 | 3/2015 | Hieda et al. |
| 9,153,456 B2 | 10/2015 | Nakajima et al. |
| 2011/0117744 A1 | 5/2011 | Ito |
| 2012/0127454 A1 | 5/2012 | Nakamura et al. |
| 2014/0087291 A1 | 3/2014 | Taniguchi et al. |
| 2014/0094015 A1 | 4/2014 | Kasa et al. |

FOREIGN PATENT DOCUMENTS

| | | |
|---|---|---|
| JP | 2008193098 A | 8/2008 |
| JP | 2011129874 A | 6/2011 |
| JP | 2012-108369 | 6/2012 |

(Continued)

OTHER PUBLICATIONS

Japanese Office Action dated Jun. 22, 2018, filed in Japanese counterpart Application No. 2015-177714, 7 pages (with translation).

Primary Examiner — Daborah Chacko-Davis
(74) Attorney, Agent, or Firm — Kim & Stewart LLP

(57) ABSTRACT

A pattern forming method includes forming a first film on a first layer and a second film on the first film. First and second concave portions are formed in the second film. A third film is formed in the concave portions and a fourth film comprising a polymer is formed on the third film. The fourth film can be processed to phase separate and form a pattern in at least the first opening. The pattern formed in the fourth film can be used in patterning films thereunder. A fifth film can be formed which covers the first concave portion and does not cover the second concave portion. The third film in the second concave portion and the first film under the second concave portion can be processed using the fifth film. The first layer can be patterned using the first, second, or third film as a mask.

18 Claims, 9 Drawing Sheets

(56) References Cited

FOREIGN PATENT DOCUMENTS

| | | |
|---|---|---|
| JP | 2014067956 A | 4/2014 |
| JP | 2014072313 A | 4/2014 |
| JP | 2014078540 A | 5/2014 |
| JP | 2014192400 A | 10/2014 |
| JP | 2015004745 A | 1/2015 |
| JP | 2015050322 A | 3/2015 |

PATTERN FORMING METHOD

CROSS-REFERENCE TO RELATED APPLICATION

This application is based upon and claims the benefit of priority from Japanese Patent Application No. 2015-177714, filed on Sep. 9, 2015, the entire contents of which are incorporated herein by reference.

FIELD

Embodiments described herein relate generally to a pattern forming method.

BACKGROUND

A block copolymer (BCP) is a copolymer containing different repeating unit types disposed along the polymeric chain in groups or blocks by type. Recently, a method of forming a fine pattern using directed self-assembly (DSA) of the BCP has attracted attention. For example, by forming a BCP film on a patterned resist layer including openings, then forming a pattern in the BCP film by phase-separating the BCP film, and then transferring the pattern to another layer, a pattern including features (e.g., holes or openings) smaller than the features (e.g., holes or openings) in the initially patterned resist layer can be formed. In this case, the minimum feature size of the overall patterning method can be determined according to the material properties of the BCP material such as a ratio between total amounts of different polymer blocks and/or molecular weights (e.g., chain length of the block groups) of the different polymer blocks.

There are many cases in which a semiconductor device layer has patterns with different feature sizes. However, in general, if the patterns are formed using BCP in a directed self-assembly process, then feature size is determined by a material properties of the BCP film rather than arbitrarily. For this reason, if multiple patterns with features sizes different from each other are to be formed in one layer, then patterning may require separately performed lithography processes to produce the different final feature sizes. As a result, the number of processes for manufacturing a semiconductor device will be increased, and consequently manufacturing cost of a semiconductor device increases.

DESCRIPTION OF THE DRAWINGS

FIGS. 1A and 1B to FIGS. 7A and 7B illustrate processes in a pattern forming method according to a first embodiment.

DETAILED DESCRIPTION

In general, according to one embodiment, a pattern forming method includes forming a first film on a first layer (a to-be processed layer). A second film is formed on the first film. A first concave portion having a first width and a second concave portion having a second width greater than the first width is formed in the second film. A third film is formed in the first and second concave portions as conformal film thereon. A fourth film is formed on the third film in the first and second concave portions. The fourth film comprises a polymer having a first portion and a second portion that are phase-separable from each other. The fourth film is processed so as to phase separate such that the first and second portions of the polymer form a first pattern region in the fourth film in which the first portion predominates and a second region in which the second portion predominates. At least a portion of the first pattern region is removed. The third film is patterned in the first concave portion using the second pattern region in the fourth film as a patterning mask. The first film under the first concave portion is patterned using at least one of the second pattern region and the third film as a patterning mask. A fifth film is formed on the first, second, and third films. The fifth film closes an opening above the first concave portion and while leaving at least a portion of an opening above the second concave portion unclosed. The third film in the second concave portion and the first film under the second concave portion is patterned using the fifth film as a patterning mask. The first layer is patterned using at least one of the first, second, and third films as a patterning mask.

Hereinafter, an embodiment will be described with reference to the accompanying drawings.

First Embodiment

FIGS. 1A to 7B are sectional views illustrating a pattern forming method according to a first embodiment. The pattern forming method according to the first embodiment can be used for fabricating, for example, a NAND flash memory.

Figure 1A:
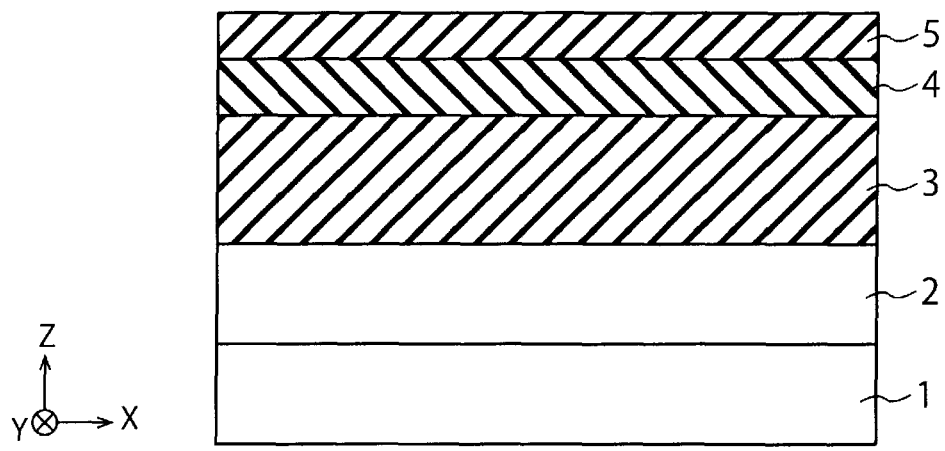

First, as depicted in FIG. 1A, a base layer 2, a processed layer 3, a first mask layer 4, and a resist layer 5 are sequentially formed on a substrate 1. The first mask layer 4 is an example of a first film. The resist layer 5 is an example of a second film.

As an example, the substrate 1 is a semiconductor substrate comprising silicon or the like. FIG. 1A illustrates X and Y directions which are parallel with a main surface of the substrate 1 and are perpendicular to each other, and the Z direction is perpendicular (orthogonal) to the main surface of the substrate 1. In the present specification, a +Z direction denotes an upward direction (e.g., away from the main surface of the substrate), and the −Z direction denotes a downward direction (e.g., towards the main surface of the substrate). In the present embodiment, the −Z direction may coincide with the gravity direction, or may not coincide with the gravity direction.

As an example, the base layer 2 and the processed layer 3 are various conductive layers, semiconductor layers, insulating layers, or the like. As illustrated in FIG. 1A, the processed layer 3 may be formed on the substrate 1 via the base layer 2, or may be formed directly on the substrate 1 without any intervening base layer 2. In the present embodiment, the processed layer 3 is, for example, a tetraethyl orthosilicate (TEOS) film formed by using a plasma chemical vapor deposition (CVD) method. In the present embodiment, the thickness of the processed layer 3 is 100 nm. The processed layer 3 can be a layer which once patterned remains within a finished semiconductor device formed on the substrate 1. The processed layer 3 can also be a layer which once patterned is used in the patterning or formation of a device layer. For example, the processed layer 3 may be a masking layer (e.g., hard mask layer) used to pattern another film layer.

As an example, the first mask layer 4 is a bottom anti-reflective coating (BARC) film, and functions as an anti-reflective film when the resist layer 5 is exposed in an optical lithography process. In the present embodiment, the first mask layer 4 is an organic film formed by using a spin-coating method with a thickness of 60 nm.

Figure 1B:
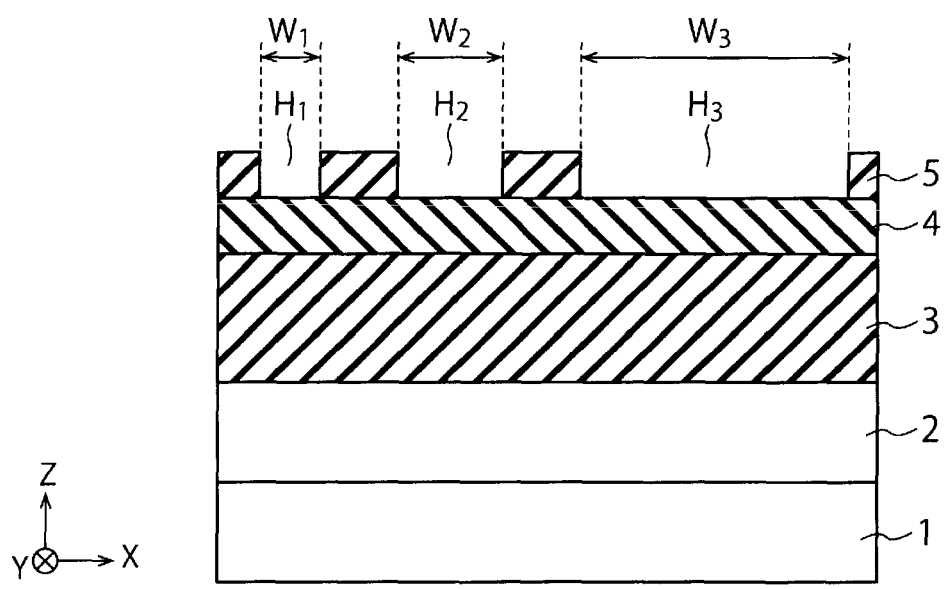

A first opening portion $H_1$, a second opening portion $H_2$, and a third opening portion $H_3$ are formed in the resist layer 5 using lithography processing (see FIG. 1B). The lithography processing uses, for example, an ArF (argon-fluoride) immersion lithography exposure apparatus. The first opening portion $H_1$ is an example of a first concave portion, and the second and third opening portions $H_2$ and $H_3$ are each examples of a second concave portion. In addition, the first, second, and third opening portions $H_1$, $H_2$, and $H_3$ are respectively examples of first, second, and third concave portions.

FIG. 1B illustrates a width $W_1$ of the first opening portion $H_1$ in the X direction, a width $W_2$ of the second opening portion $H_2$ in the X direction, and a width $W_3$ of the third opening portion $H_3$ in the X direction. The width $W_1$ is, for example, 110 nm. The width $W_2$ is set to be longer than the width $W_1$ and is, for example, 170 nm. The width $W_3$ is set to be longer than the width $W_2$ and ism for example, 1 μm. The width $W_1$ is an example of a first width. The width $W_2$ and the width $W_3$ are examples of a second width. In addition, the widths $W_1$, $W_2$, and $W_3$ are respectively examples of first, second, and third widths.

The first opening portion $H_1$ according to the present embodiment is a hole pattern corresponding to a portion of a memory cell unit. Hence, the width $W_1$ denotes a diameter of the first opening portion $H_1$. The second opening portion $H_2$ according to the present embodiment is a hole pattern corresponding to a portion of a peripheral circuit unit. Hence the width $W_2$ denotes a diameter of the second opening portion $H_2$. The third opening portion $H_3$ according to the present embodiment is a groove pattern corresponding to a portion of an alignment mark (for performing subsequent lithography steps or the like) extending in the Y direction. Hence, the width $W_3$ denotes a line width of the third opening portion $H_3$.

Figure 2A:
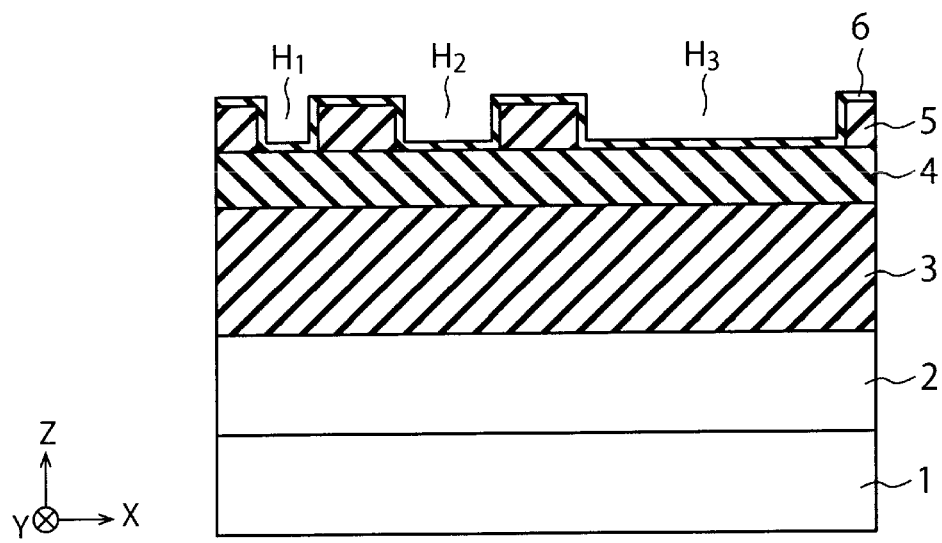

Subsequently, a second mask layer 6 is formed on the entire surface of the substrate 1 (FIG. 2A). As a result, the second mask layer 6 is formed in the first, second, and third opening portions $H_1$, $H_2$, and $H_3$. The second mask layer 6 is an example of a third film.

The second mask layer 6 according to the present embodiment is an inorganic film such as a silicon oxide film formed by atomic layer deposition (ALD) or the like. The thickness of the second mask layer 6 according to the present embodiment is 20 nm. The second mask layer 6 according to the present embodiment is conformally formed on the entire surface of the substrate 1. As a result, the second mask layer 6 is formed on the side surfaces and the bottom surfaces of the first, second, and third opening portions $H_1$, $H_2$, and $H_3$.

Figure 2B:
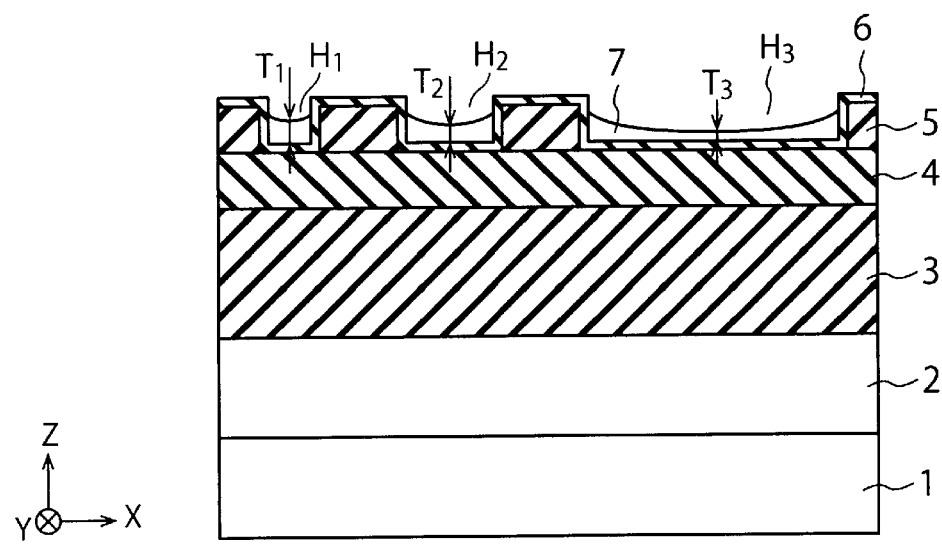

Subsequently, a polymer film 7 is formed on portions of the second mask layer 6 in the first, second, and third opening portions $H_1$, $H_2$, and $H_3$ by spin-coating of a liquid containing the polymer of polymer film 7 (FIG. 2B). The polymer according to the present embodiment is a BCP, such as polystyrene-b-polymethylmethacrylate (PS-b-PMMA), and thus, the polymer film 7 according to the present embodiment is a BCP film. The polymer film 7 is an example of a fourth film.

FIG. 2B illustrates a minimum film thickness $T_1$ of the polymer film 7 in the first opening portion $H_1$, a minimum film thickness $T_2$ of the polymer film 7 in the second opening portion $H_2$, and a minimum film thickness $T_3$ of the polymer film 7 in the third opening portion $H_3$. The minimum film thickness $T_1$ is an example of a first minimum film thickness, and the minimum film thicknesses $T_2$ and $T_3$ are examples of a second minimum film thickness. In addition, the minimum film thicknesses $T_1$, $T_2$, and $T_3$ are respectively examples of the first, second, and third minimum film thicknesses.

A surface of the polymer film 7 in the first opening portion $H_1$ has a concave shape in general. Hence, the minimum film thickness $T_1$ corresponds to a thickness of the central portion of the polymer film 7 in the first opening portion $H_1$. This is also applicable to the minimum film thicknesses $T_2$ and $T_3$, in the same manner as above. In the present embodiment, the width $W_2$ is greater than the width $W_1$ and the width $W_3$ is greater than the width $W_2$, and thus, the minimum film thickness $T_2$ will generally be smaller than the minimum film thickness $T_1$, and the minimum film thickness $T_3$ will generally be smaller than the minimum film thickness $T_2$ over the relevant feature size ranges.

Figure 8:
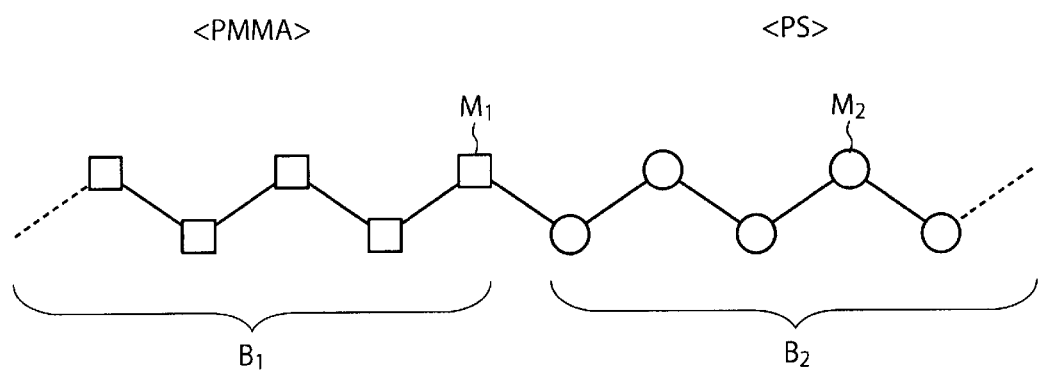
FIG. 8 is a schematic diagram illustrating a molecular structure of BCP according to the first embodiment.

FIG. 8 is a schematic diagram illustrating a molecular structure of a BCP material used in the first embodiment.

BCP material according to the present embodiment is composed of a polymethylmethacrylate (PMMA) block $B_1$ containing multiple monomers $M_1$ (methylmethacrylate units), and a polystyrene (PS) block $B_2$ containing multiple monomers $M_2$ (styrene units). The PMMA block $B_1$ is an example of a first portion and an example of a first polymer block. The PS block $B_2$ is an example of a second portion and an example of a second polymer block.

In the present embodiment, a ratio of molecules in the PMMA block $B_1$ and the PS block $B_2$ is set such that a predetermined cylindrical phase is formed in the BCP film. Specifically, the ratio is set such that a cylindrical phase with a diameter of 20 nm is formed in the BCP film of the first opening portion $H_1$ by the PMMA block $B_1$.

Hereinafter, a pattern forming method according to the present embodiment will be described with reference to FIG. 3A to FIG. 7B.

Figure 3A:
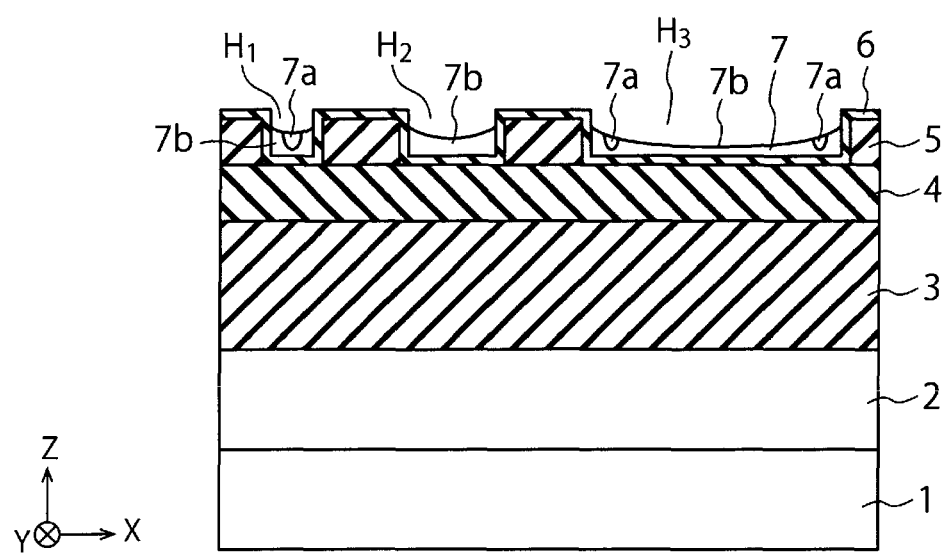

After deposition of the polymer film 7, annealing is performed, and the PMMA block $B_1$ and the PS block $B_2$ phase separate (FIG. 3A). In doing so, a first pattern 7a containing the PMMA block $B_1$ and a second pattern 7b containing the PS block $B_2$ are formed in the polymer film 7. For example, the above-described annealing is performed for one minute at 250° C. in nitrogen ($N_2$) atmosphere. In the present embodiment, a columnar pattern which is called a cylindrical phase is formed as the first pattern 7a. Here, the first opening portion $H_1$ functions as a guide for adjusting a position or a shape of the first pattern 7a.

In the present embodiment, the phase separation of the polymer film 7 occurs in the first opening portion $H_1$ and only one first pattern 7a is formed in the polymer film 7 disposed in the first opening portion $H_1$. The reason is that the width $W_1$ of the first opening portion $H_1$ is set such that phase separation occurs in the first opening portion $H_1$ and only one first pattern 7a is formed in the first opening portion $H_1$. The first pattern 7a in the first opening portion $H_1$ is formed in the central portion of the first opening portion $H_1$.

In addition, in the present embodiment, phase separation of the polymer film 7 does not occur in the second opening portion $H_2$, and a first pattern 7a is not formed in the polymer film 7 disposed in the second opening portion $H_2$. The reason is that the width $W_2$ of the second opening portion $H_2$ is different from the width $W_1$ of the first opening portion $H_1$ and set such that phase separation of polymer film 7 does not easily occur.

In addition, in the present embodiment, phase separation of the polymer film 7 occurs in the third opening portion $H_3$, and multiple first patterns 7a are formed in the polymer film 7 disposed in the third opening portion $H_3$. The reason is that the width $W_3$ of the third opening portion $H_3$ is large, and thus, the PMMA block $B_1$ and the PS block $B_2$ easily and freely move within the polymer film 7 to allow phase segregation. The first pattern 7a in the third opening portion $H_3$ is formed in the peripheral portion of the third opening portion $H_3$.

In some embodiments, one or multiple first patterns 7a may be formed in the second opening portion $H_2$. In addition, in some embodiments, only one first pattern 7a may be formed in the third opening portion $H_3$, and in other embodiments the first pattern 7a may not be formed in the third opening portion $H_3$ at all.

Figure 9A:
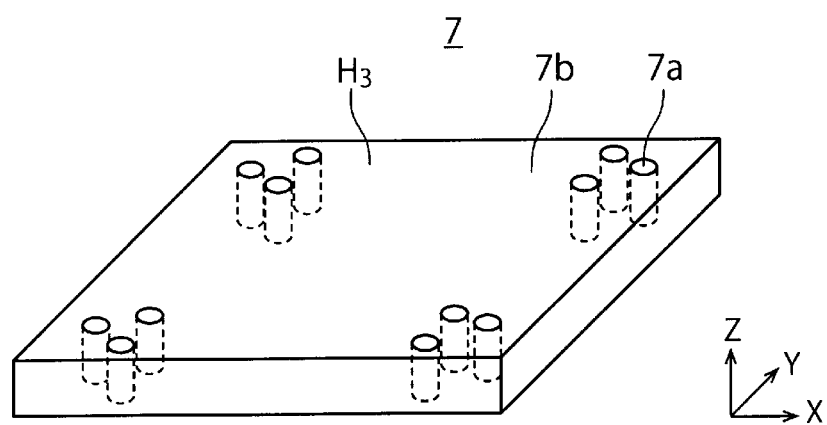
FIGS. 9A and 9B are perspective views illustrating examples of a first pattern in a third opening portion according to the first embodiment.
Figure 9B:
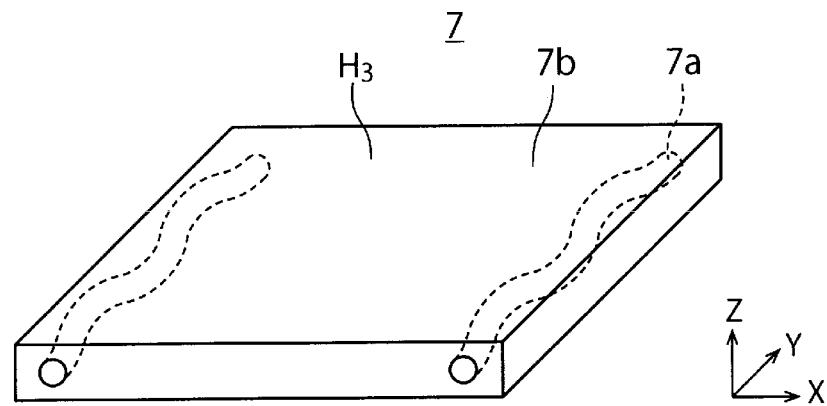

FIGS. 9A and 9B are perspective views illustrating examples of the first pattern 7a in the third opening portion $H_3$ according to the first embodiment.

FIG. 9A illustrates a first example of the first patterns 7a in the third opening portion $H_3$. In the first example, the first patterns 7a extend in parallel in the Z direction.

FIG. 9B illustrates a second example of the first patterns 7a in the third opening portion $H_3$. In the second example, the first patterns 7a vertically extend in the Z direction.

The first patterns 7a in the first opening portion $H_1$ are formed so as to extend in parallel in the Z direction in the same manner as in the first example (depicted in FIG. 9A).

Hereinafter, a pattern forming method according to the present embodiment will be continuously described with reference to FIG. 3B to FIG. 7B.

Figure 3B:
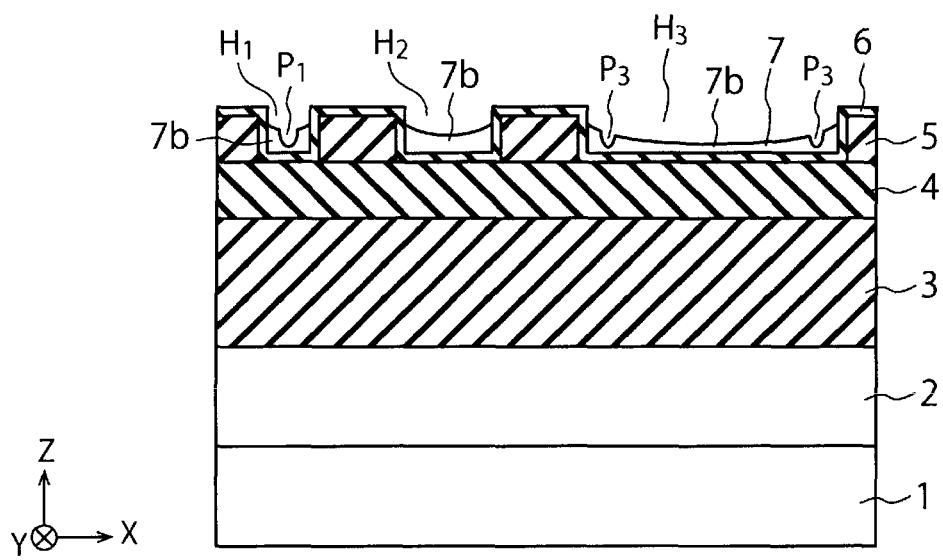

Subsequently, the first pattern 7a is selectively removed, leaving the second pattern 7b behind (FIG. 3B). By doing so, one opening portion $P_1$ is formed in the polymer film 7 of the first opening portion $H_1$, and multiple opening portions $P_3$ are formed in the polymer film 7 of the third opening portion $H_3$. The opening portion $P_1$ according to the present embodiment is a hole pattern with a diameter of 20 nm. For example, the selective removal of the first patterns 7a is performed by irradiating the polymer film 7 with vacuum-ultraviolet (VUV) light which cause chain scissions in the PMMA block $B_1$, which lowers the molecular weight of the PMMA material and breaks linkages to the PS Block $B_2$, which allows the thusly degraded PMMA material to be dissolved using isopropyl alcohol (IPA) as a solvent (developer).

Figure 4A:
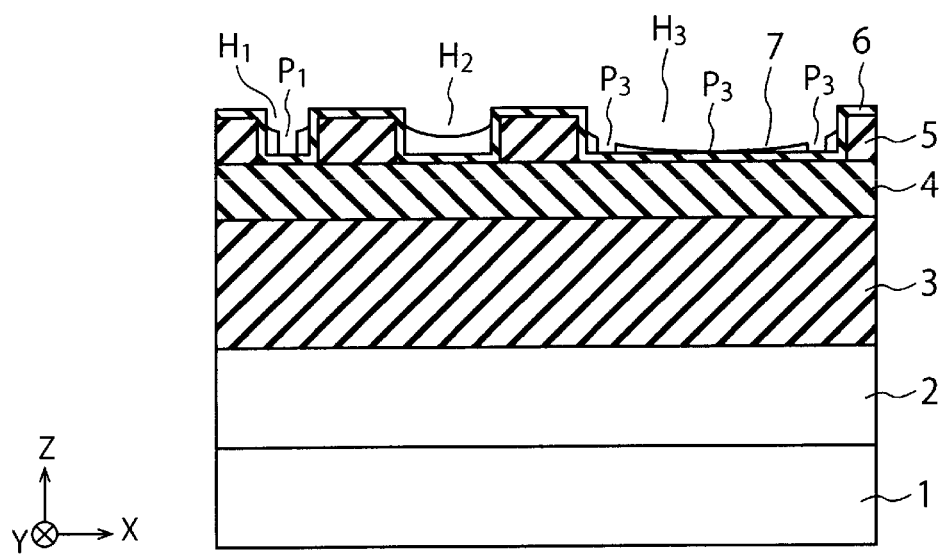

Subsequently, remaining portions of the polymer film 7 still in underneath the opening portions $P_1$ and $P_3$ can be removed by using a reactive ion etching (RIE) method (FIG. 4A). By doing so, the second mask layer 6 is exposed within the opening portions $P_1$ and $P_3$. The RIE method does not just remove the remaining portions of polymer film 7 underneath the openings $P_1$ and $P_3$, but rather acts to reduce the overall thickness of all remaining portions of the polymer film 7 in an approximately uniform manner. At this time, because the thickness of the polymer film 7 of the third opening portion $H_3$ is smaller in the central portion than in the peripheral portion an opening portion $P_3$ may also formed in the central portion of the polymer film 7 disposed in the third opening portion $H_3$.

Figure 4B:
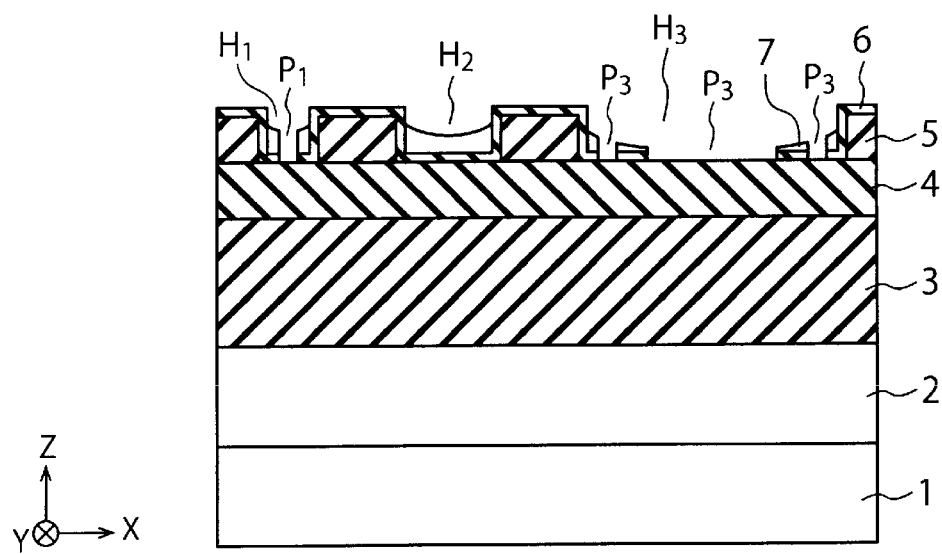

Subsequently, etching is performed by using the remaining portions of polymer film 7 (second pattern 7b) as a mask, and thereby the second mask layer 6 in the bottom portion of the opening portions $P_1$ and $P_3$ is removed (FIG. 4B). As a result, the opening portions $P_1$ and $P_3$ are transferred to the second mask layer 6, and the first mask layer 4 is exposed in the opening portions $P_1$ and $P_3$.

Figure 5A:
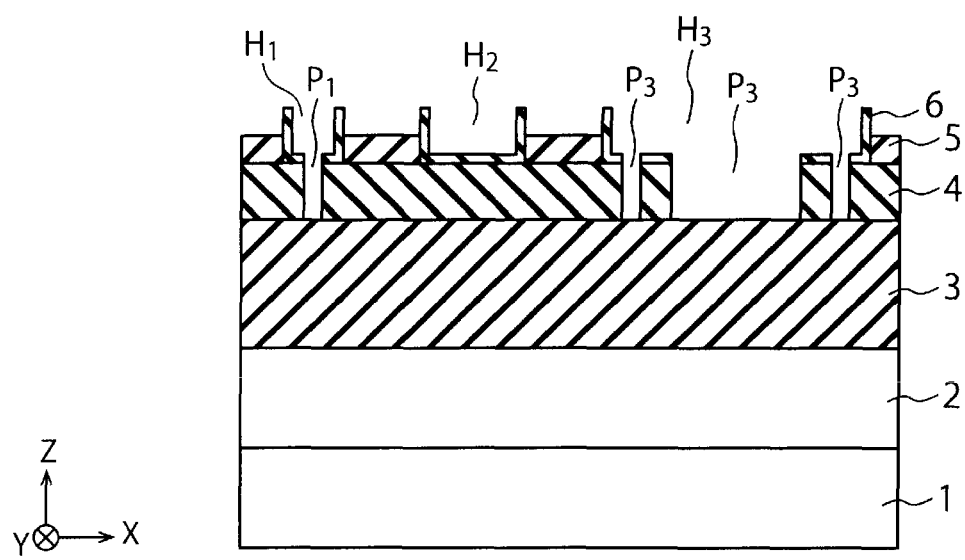

Subsequently, etching is performed by using at least one of the remaining portions of the polymer film 7 and the second mask layer 6 as a mask, and thereby the first mask layer 4 in the bottom portion of the opening portions $P_1$ and $P_3$ is removed (FIG. 5A). As a result, the opening portions $P_1$ and $P_3$ are transferred to the first mask layer 4, and the processed layer 3 is exposed in the opening portions $P_1$ and $P_3$. Since both the first mask layer 4 and the polymer film 7 are organic films, at least portions of polymer film 7 will also be removed during etching of the first mask layer 4.

The opening portion $P_1$ is thus made to pass through the second mask layer 6 in the first opening portion $H_1$ and the first mask layer 4 under the first opening portion $H_1$. In the same manner, the multiple opening portions $P_3$ are made to pass through the second mask layer 6 in the first opening portion $H_1$ and the first mask layer 4 under the first opening portion $H_1$. Meanwhile, an opening portion is not formed in the second mask layer 6 in the second opening portion $H_2$ nor in the first mask layer 4 under the second opening portion $H_2$.

Figure 5B:
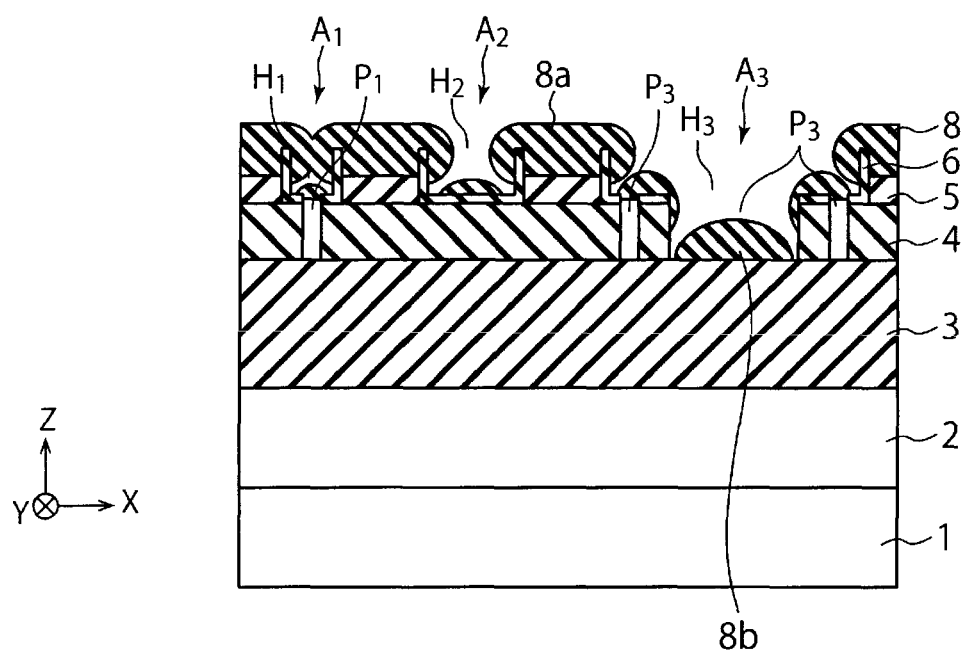

Subsequently, an organic film 8 is formed on the substrate 1 by using mixed gas in which methane ($CH_4$) gas is mixed with tetrafluoromethane ($CF_4$) gas (FIG. 5B). The organic film 8 according to the present embodiment is a fluorocarbon film formed by generating plasma at a low bias using the mixed gas. Furthermore, the organic film 8 may contain hydrogen. The organic film 8 can be formed in an etching chamber in which the etching of FIG. 4B and FIG. 5A is performed. The organic film 8 is an example of a fifth film.

The organic film 8 according to the present embodiment is formed on the exposed portions of the processed layer 3 (in opening portion $H_3$), the first mask layer 4, the resist layer 5, and the second mask layer 6. The formation of organic film 8 is performed so as to cover the first opening portion $H_1$, and so as not to cover the second and third opening portions $H_2$ and $H_3$. An arrow $A_1$ denotes a state in which end portions of the organic film 8 come into contact with each other on the first opening portion $H_1$, and an opening end (upper end) of the first opening portion $H_1$ is covered by the organic film 8. Arrows $A_2$ and $A_3$ denote a state in which end portions (upper ends) of the second and third opening portions $H_2$ and $H_3$ are not covered by the organic film 8. The organic film 8 includes a portion 8a which is formed on a surface of the first mask layer 4, the resist layer 5, or the second mask layer 6, and a portion 8b which is formed on an exposed surface of the processed layer 3.

In the present embodiment, the width $W_1$ of the first opening portion $H_1$ is set to be smaller than the width $W_2$ of the second opening portion $H_2$ or the width $W_3$ of the third opening portion $H_3$. For this reason, the first opening portion $H_1$ is covered before the second and third opening portions $H_2$ and $H_3$ are covered. Hence, in the present embodiment, the organic film 8 is continuously deposited until the first opening portion $H_1$ is covered, and deposition of the organic film 8 is completed before the second and third opening portions $H_2$ and $H_3$ are covered.

The organic film 8 may be formed by using only methane ($CH_4$) gas in some embodiments. In this case, the organic film 8 is contains carbon and does not contain fluorine. Furthermore, the organic film 8 may further contain hydrogen.

Figure 6A:
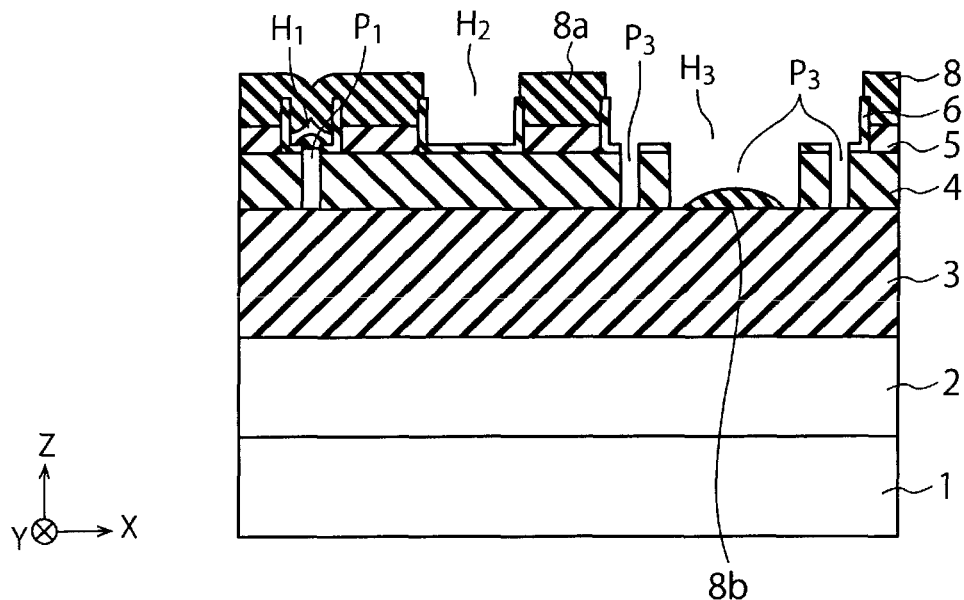

Subsequently, the organic film 8 is isotropically etched by using oxygen ($O_2$) gas (FIG. 6A). As a result, the organic film 8 in the second opening portion $H_2$ is removed, and the second mask layer 6 in the second opening portion $H_2$ is exposed.

Since the first opening portion $H_1$ is covered, oxygen ions or oxygen radicals hardly reach the organic film 8 in the first opening portion $H_1$. Meanwhile, since the second opening portion $H_2$ is not covered, oxygen ions or oxygen radicals easily reach the organic film 8 in the second opening portion $H_2$. Hence, in a state in which the first opening portion $H_1$ is covered by the organic film 8, it is possible to expose the second mask layer 6 within the second opening portion $H_2$. At this time, the portion 8b of the organic film 8 in the third opening portion $H_3$ may remain or may not remain depending on relative size of the openings and particular deposition and etching parameters used in the processing.

The second mask layer 6 according to the present embodiment is an inorganic film. For this reason, the second mask layer 6 in the second opening portion $H_2$ functions as an etching stopper (etch stop layer) when the organic film 8 in the second opening portion $H_2$ is etched. Hence, in the present embodiment, the size (width) of the second opening portion $H_2$ in a horizontal direction can be accurately controlled by the second mask layer 6.

Figure 6B:
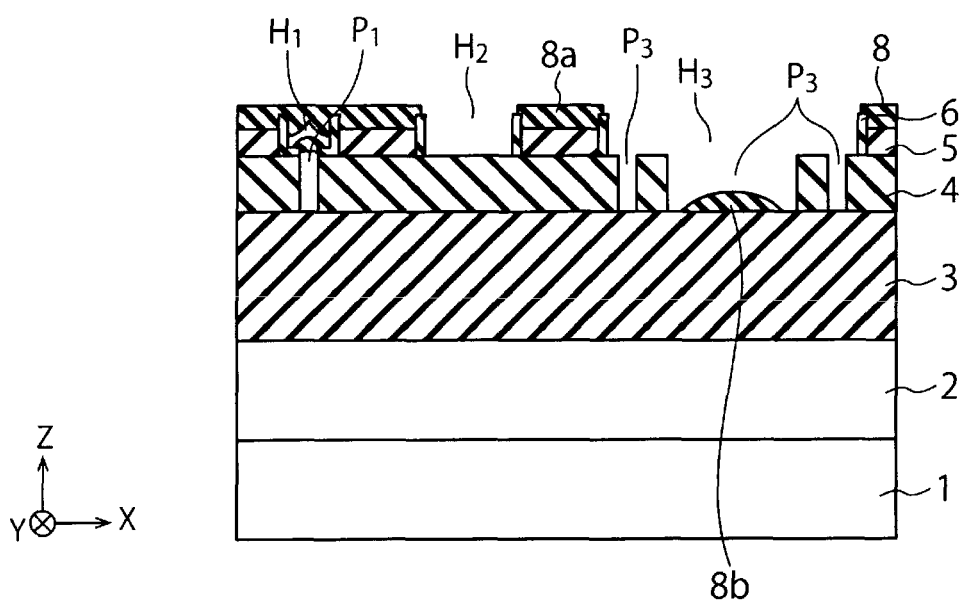

Subsequently, the second mask layer 6 on the bottom surface of the second opening portion $H_2$ is removed by a RIE method, using the organic film 8 as a mask (FIG. 6B). As a result, the first mask layer 4 is exposed on the bottom surface of the second opening portion $H_2$. At this time, the second mask layer 6 remaining on the bottom surface of the third opening portion $H_3$ is also removed.

Figure 7A:
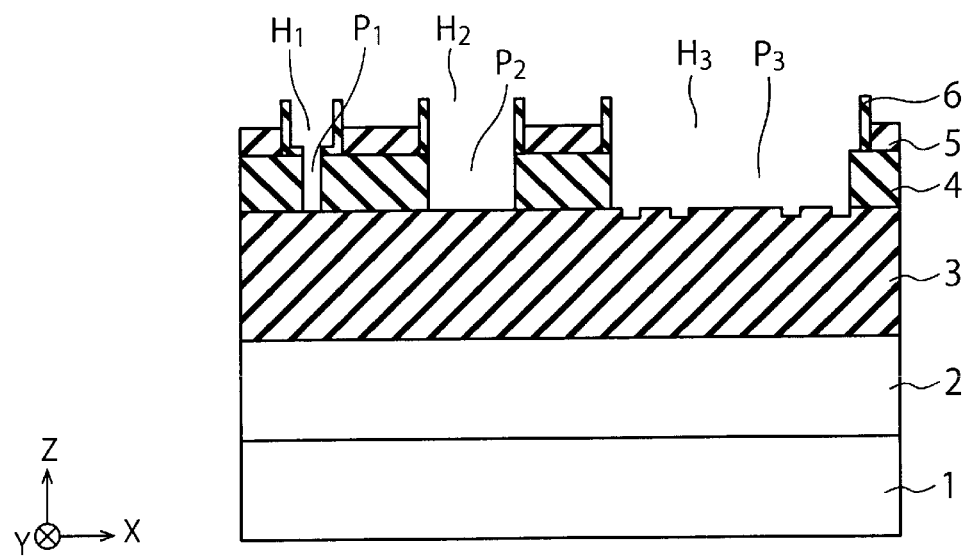

Subsequently, the first mask layer 4 under the second opening portion $H_2$ is removed by a RIE method, using the organic film 8 as a mask (FIG. 7A). As a result, the processed layer 3 becomes exposed under the second opening portion $H_2$. At this time, the first mask layer 4 remaining on the bottom surface of the third opening portion $H_3$ is also removed.

Since both the first mask layer 4 and the organic film 8 are organic films, the organic film 8 is also etched during etching of the first mask layer 4. Hence, in the etching of FIG. 7A, if the organic film 8 is removed, the underlying resist layer 5 or the second mask layer 6 functions as a mask thereafter.

In FIG. 7A, over-etching is performed until the organic film 8 of the first opening portion $H_1$ and/or the third opening portion $H_3$ is completely removed. At this time, the second mask layer 6 remains on the bottom surface of the first opening portion $H_1$, and thus, it is possible to prevent the opening portion $P_1$ from being expanded laterally.

The second mask layer 6 in the second opening portion $H_2$ and the first mask layer 4 under the second opening portion $H_2$ are removed, and the processed layer 3 is exposed under the second opening portion $H_2$. FIG. 7A illustrates the opening portion $P_2$ which passes through the second mask layer 6 in the second opening portion $H_2$ and the first mask layer 4 under the second opening portion $H_2$. In the same manner, the second mask layer 6 remaining in the third opening portion $H_3$ and the first mask layer 4 remaining under the third opening portion $H_3$ are removed, and the processed layer 3 is fully exposed under the third opening portion $H_3$. Meanwhile, the processed layer 3 is already exposed in advance in the opening portion $P_1$ under the first opening portion $H_1$.

Figure 7B:
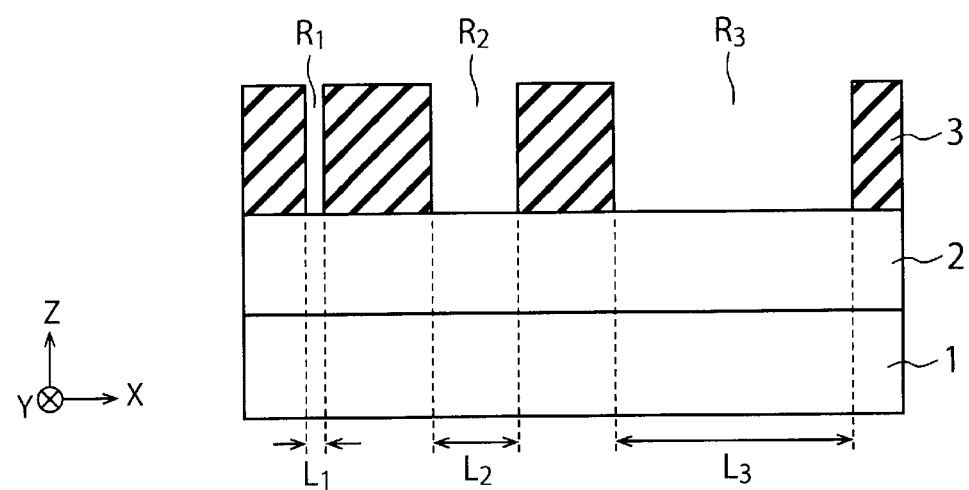

Subsequently, the processed layer 3 is processed by using a RIE method, using at least one of the first mask layer 4, the resist layer 5, and the second mask layer 6 as a mask (FIG. 7B). As a result, first, second, and third opening portions $R_1$, $R_2$, and $R_3$ are respectively formed in the processed layers 3 under the first, second, and third opening portions $H_1$, $H_2$, and $H_3$. The second mask layer 6 is removed by the RIE method. Thereafter, the first mask layer 4 and the resist layer 5 are removed by ashing or the like.

FIG. 7B illustrates a width $L_1$ of the first opening portion $R_1$ in the X direction, the width $L_2$ of the second opening portion $R_2$ in the X direction, and the width $L_3$ of the third opening portion $R_3$ in the X direction. The first opening portion $R_1$ according to the present embodiment is a hole pattern in a memory cell portion, and the width (diameter) $L_1$ is 20 nm. The second opening portion $R_2$ according to the present embodiment is a hole pattern in a periphery circuit portion, and the width (diameter) $L_2$ is 100 nm. The width $L_2$ is greater than the width $L_1$. The third opening portion $R_3$ according to the present embodiment is a groove pattern for an alignment mark extending in the Y direction, and the width (line width) $L_3$ is 1 µm. The width $L_3$ is greater than the width $L_2$.

Thereafter, a metal material is buried in the first, second, and third opening portions $R_1$, $R_2$, and $R_3$. By doing so, contact plugs are formed in the first and second opening portions $R_1$ and $R_2$, and an alignment mark is formed in the third opening portion $R_3$.

As described above, in the present embodiment, the first mask layer 4 under the first opening portion $H_1$ is processed by using the polymer film 7 as a mask, and the first mask layer 4 under the second and third opening portions $H_2$ and $H_3$ is processed by using the organic film 8 as a mask. Hence, according to the present embodiment, lithography is simply performed once when the first to third opening portions $H_1$ to $H_3$ are formed (refer to FIG. 1B), and thus, it is possible to form the first to third opening portions $R_1$ to $R_3$ having desired sizes in the processed layer 3.

In the present embodiment, by using the organic film 8 as a mask, it is possible to prevent lithography from having to be performed twice or more. For example, if the lithography is performed after etching, the substrate 1 would have to be moved from an etching chamber to an exposure machine (e.g., stepper). However, the organic film 8 according to the present embodiment can be formed in an etching chamber, as described with reference to FIG. 5B. Hence, according to the present embodiment, it is possible to simplify fabrication processes of a semiconductor device, compared to a case in which lithography would be performed twice or more.

In the present embodiment, the polymer film 7 is used as a mask, and thus, it is possible to form the first opening portion $R_1$ with the width $L_1$ smaller than the width $W_1$ of the first opening portion $H_1$, and to form fine patterns. According to the present embodiment, it is possible to form the fine patterns by performing the lithography once in common with other patterns.

As described above, according to the present embodiment, it is possible to efficiently form multiple patterns with sizes different from each other.

The first and second opening portions $R_1$ and $R_2$ may be concave portions other than contact holes. As an example, the concave portion can be a space portion in a line and space (L/S) pattern. In the same manner, the third opening portion $R_3$ may be a concave portion other than a groove for an alignment mark.

In addition, the polymer of the polymer film 7 may be BCP material other than PS-b-PMMA. In addition, the second mask layer 6 may be an inorganic film other than a silicon oxide film. In addition, the resist layer 5 may be replaced with a mask layer other than a resist layer. For example, the resist layer 5 may be replaced with a spin-on-carbon (SOC) film, or a laminating film which includes the SOC film and a silicon oxide film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed:

1. A pattern forming method, comprising:
   forming a first film on a first layer;
   forming a second film on the first film;
   forming a first concave portion having a first width in the second film and a second concave portion having a second width greater than the first width in the second film by photolithography;
   forming a third film in at least the first and second concave portions, the third film being a conformal film;
   forming a fourth film on the third film in the first and second concave portions, the fourth film comprising a polymer with a first portion and a second portion that are phase-separable from each other;
   processing the fourth film to phase separate that first and second portions of the polymer to form a first pattern region in the fourth film in which the first portion predominates and a second pattern region in the fourth film in which the second portion predominates;
   removing at least a portion of the first pattern region;
   patterning the third film in the first concave portion using the second pattern region in the fourth film as a patterning mask;
   patterning the first film under the first concave portion using at least one of the second pattern region and the third film as a patterning mask;
   forming a fifth film on the first, second, and third films, the fifth film closing an opening above the first concave portion and while leaving at least a portion of an opening above the second concave portion unclosed;
   patterning the third film in the second concave portion and the first film under the second concave portion using the fifth film as a patterning mask; and
   patterning the first layer using at least one of the patterned first, second, and third films as a patterning mask.

2. The method according to claim 1, wherein the first and second pattern regions form in the first concave portion and not in the second concave portion.

3. The method according to claim 1, wherein first and second pattern regions of the polymer form in the first and second concave portions.

4. The method according to claim 1, wherein the fourth film is formed so as to have a first minimum film thickness in the first concave portion, and to have a second minimum film thickness in the second concave portion, the first minimum film thickness being greater than the second minimum film thickness.

5. The method according to claim 1, wherein the polymer is a block copolymer having a first polymer block as the first portion and a second polymer block as the second portion.

6. The method according to claim 1, wherein the polymer is a block copolymer formed of styrene monomer units and methylmethacrylate monomer units.

7. The method according to claim 1, wherein the fifth film comprises carbon atoms.

8. The method according to claim 7, wherein the fifth film is a fluorocarbon film.

9. The method according to claim 1, wherein removing at least a portion of the first pattern region comprises exposing the polymer to vacuum-ultraviolet light and then a solvent.

10. The method according to claim 1, wherein forming the fourth film on the third film includes spin coating the polymer from a liquid solution.

11. The method according to claim 1, wherein forming the first concave portion and the second concave portion comprises a photolithographic patterning of a photoresist film disposed on the second film.

12. A pattern forming method, comprising:
    forming a first layer on a substrate;
    forming a first film on the first layer;
    forming a second film on the first film;
    forming a first concave portion having a first width in the second film, a second concave portion having a second width greater than the first width in the second film, and a third concave portion having a third width greater than the second width in the second film;
    forming a third film on the second film and on the first film in the first, second, and third concave portions, the third film being a conformal film;
    forming a fourth film on the third film in the first, second, and third concave portion, the fourth film comprising a polymer with a first portion and a second portion that are phase-separable from each other;
    processing the fourth film to phase separate that first and second portions of the polymer to form a first pattern region in the fourth film in which the first portion predominates and a second pattern region in the fourth film in which the second portion predominates;
    removing at least a portion of the first pattern region;
    patterning the third film in the first concave portion using the second pattern region as a patterning mask;
    patterning the first film under the first concave portion using at least one of the second pattern region and the third film as a patterning mask;
    forming a fifth film on the first, second, and third films, the fifth film closing an opening above the first concave portion while leaving at least a portion of the opening above each of the second and third concave portions unclosed;
    patterning the third film in the second and third concave portions and the first film under the second and third concave portions using the fifth film as a patterning mask; and
    patterning the first layer using at least one of the patterned first, second, and third films as a patterning mask.

13. The method according to claim 12, wherein the first and second pattern regions form in the first and third concave portions and not in the second concave portion.

14. The method according to claim 12, wherein the fourth film is formed so as to have a first minimum film thickness in the first concave portion, a second minimum film thickness in the second concave portion, and a third minimum film thickness in the third concave portion, the second minimum film thickness being less than the first minimum film thickness, and the third minimum film thickness being less than the second minimum film thickness.

15. The method according to claim 12, wherein the polymer is a block copolymer formed of styrene monomer units and methylmethacrylate monomer units.

16. The method according to claim 12, wherein the fifth film is a fluorocarbon film.

17. The method according to claim 12, wherein removing at least a portion of the first pattern region comprises exposing the polymer to vacuum-ultraviolet light and then a solvent.

18. The method according to claim 12, wherein forming the fourth film on the third film includes spin coating the polymer from a liquid solution.

* * * * *